United States Patent [19]
Martinis et al.

[11] Patent Number: 5,880,467
[45] Date of Patent: Mar. 9, 1999

[54] MICROCALORIMETER X-RAY DETECTORS WITH X-RAY LENS

[75] Inventors: John Matthew Martinis; Gene Charles Hilton, both of Boulder; Kent David Irwin, Lyons; David Anders Wollman, Louisville, all of Colo.; Robert Gregory Downing, Niskayuna; Walter Maxwell Gibson, Voorheesville, both of N.Y.

[73] Assignee: The United States of America as represented by the Secretary of Commerce, Washington, D.C.

[21] Appl. No.: 811,939

[22] Filed: Mar. 5, 1997

[51] Int. Cl.$^6$ ..................................................... G02B 5/124
[52] U.S. Cl. ............................................................. 250/310
[58] Field of Search ..................... 250/310, 306, 250/307, 505.1; 378/43, 145

[56] References Cited

U.S. PATENT DOCUMENTS

| | | | |
|---|---|---|---|
| 3,582,653 | 6/1971 | Howard | 378/157 |
| 4,058,486 | 11/1977 | Mallozzi et al. | 378/119 |
| 4,953,188 | 8/1990 | Siegal et al. | 378/43 |
| 5,119,411 | 6/1992 | Nakamura et al. | 378/206 |
| 5,192,869 | 3/1993 | Kumakhov et al. | 250/505.1 |
| 5,204,887 | 4/1993 | Hayashida et al. | 378/43 |
| 5,210,779 | 5/1993 | Vali et al. | 378/84 |
| 5,434,901 | 7/1995 | Nagai | 378/43 |
| 5,497,008 | 3/1996 | Kumakhov et al. | 250/505.1 |
| 5,550,887 | 8/1996 | Schmal et al. | 378/43 |
| 5,570,408 | 10/1996 | Gibson | 378/145 |
| 5,634,718 | 6/1997 | Martinis et al. | 374/32 |

OTHER PUBLICATIONS

Irwin, Hilton, Wollman, & Cabrera, "A Hot–Electron Microcalorimeter for X–Ray Detection Using a Superconducting Transition–Edge Sensor Microcalorimeter with Electrothermal Feedback," *Elsevier Science,* Jan. 1996, pp. 177–179.

Bly & Gibson, "Polycapillary Optics Focus and Collimate X–Rays", *Lasers Focus World,* Mar. 1996.

Irwin, Hilton, Wollman & Martinis, "X–Ray Detection Using a Superconducting Transition–Edge Sensor Microcalorimeter with Electrothermal Feedback," *Appl. Phys. Lett.* 69 (13), Sep. 23, 1996, pp. 1945–1947.

*Primary Examiner*—Kiet T. Nguyen
*Attorney, Agent, or Firm*—Charles E. Rohrer, P.C.

[57] ABSTRACT

Spectroscopic materials analysis wherein a sample under test is bombarded by electrons in a scanning electron microscope to produce an x-ray emission collected over a large solid angle by a polycapillary lens and focused onto the surface of a microcalorimeter detector. The x-ray lens is used to increase the effective collection area of the microcalorimeter detector used in an x-ray spectrometer. By increasing the collection angle, the time period for x-ray collection is reduced and the detector can be located farther from the x-ray source. The x-ray lens is effective over a broad energy range of x-rays, thus providing compatibility with spectroscopic analysis. The microcalorimeter can be calibrated to compensate for any variations in the transmission efficiency of the x-ray lens.

17 Claims, 1 Drawing Sheet

MICROCALORIMETER X-RAY DETECTORS WITH X-RAY LENS

This invention relates to microcalorimeter detectors used as x-ray spectrometers and, more specifically, to a microcalorimeter detector in an electron microscope having improved x-ray collection efficiency.

BACKGROUND OF THE INVENTION

Every element in nature emits x-rays when excited, such as when bombarded by high energy electrons. The emitted x-rays have a set of characteristic energies. When an x-ray is detected and its energy accurately determined, one can infer from the energy the constituent element from which it originated. For example, if x-ray measurement is taken on an unknown sample having many different constituent elements, the x-rays collected from the unknown sample can be tabulated according to energy in an x-ray spectrum. Analysis of the spectrum enables the deduction of the constituent elements and analysis of intensity indicates concentration. This is the basic approach for a class of analytical measurement instruments serving a wide variety of industries ranging from mining (ore composition) to semiconductor fabrication (composition and contaminant determination).

Commercial instruments today are primarily based on one of two detector technologies. The most widely used technology is Energy Dispersive Spectroscopy (EDS) which uses a crystal of silicon cooled to 77 degrees Kelvin as the detecting element. In the EDS technique, the x-rays strike the silicon creating mobile electrons which move under the influence of an applied electric potential. An amplifier is used to measure the electrical current of these electrons, the magnitude of the current being proportional to the energy of the x-ray that interacted with the crystal. Because silicon detectors typically have collection areas that are greater than 9 mm$^2$, and can be placed within one to two centimeters of the sample, good collection efficiency is possible. However, because of the statistical noise inherent in the detection process, a limiting energy resolution of only about 100 electron volts (eV) is obtainable.

Wavelength Dispersive Spectrometers (WDS) constitute the second commonly used type of detector technology. In WDS, x-rays from the sample under test are defracted by an analyzer crystal at angles that depend on the x-ray energy. WDS detectors have good energy resolution, approximately ten to twenty eV, but they have a small collection angle. Two additional difficulties with WDS are that the analyzing crystal must be mechanically rotated for each energy to be measured, and that the collection efficiency changes as this rotation occurs. Thus the WDS technique is difficult for spectroscopy.

The type of detector used in the invention is the x-ray microcalorimeter. This device is based on calorimetry: when the x-ray is absorbed, its energy is converted into heat and the subsequent temperature rise is proportional to the x-ray energy. Because the actual x-ray energy is quite small, the heat capacity of the detector must also be small so that a relatively large temperature rise is observed. This is accomplished by operating the device at very low temperatures where materials have lower heat capacities, and by minimizing the size of the detector. Microcalorimeter x-ray detectors have obtained energy resolution as good as 8 eV and have the potential to achieve 0.5 eV. It is easier to obtain good energy resolution when the detectors are made with small absorbing area. Present detectors, which have areas of 0.1 to 0.25 mm$^2$, are typically placed from approximately 2–3 cm from the sample and thus have collection efficiencies that are significantly smaller than EDS systems. This is an important disadvantage, causing long x-ray collection times.

In designing a microcalorimeter spectrometer system, the inventors herein recognized that the significant advantage of the microcalorimeter, i.e., a large improvement in resolution over other detectors is facilitated by a small detector size. Small detectors, however, have the disadvantages of poor collection efficiency and long collection times. The invention herein describes the solution to these problems which the inventors have devised.

Accordingly, an object of this invention is to improve the collection efficiency of microcalorimeters, thereby reducing the collection time of x-ray samples.

Another object of the present invention is to provide a microcalorimeter with an increased effective collection area that is substantially independent of x-ray energy over a broad energy range.

Another object of the invention is to provide a microcalorimeter with an increased effective collection area that is substantially independent of alignment between the microcalorimeter and the x-ray source, as may be necessary in systems in which the sample is scanned, such as in a scanning electron microscope.

These and other features and objects of the invention and the manner of attaining them will become apparent and the invention itself will best be understood through the following description of embodiments with the accompanying drawing.

SUMMARY OF THE INVENTION

The objects of the invention are achieved by a system which utilizes a broadband polycapillary x-ray lens positioned between a microcalorimeter and an x-ray source at the two respective focal points of the lens. Recent developments in polycapillary lenses allow x-rays to be collected over an approximately 22 degree opening angle, and then focused to a spot size of about 100 micrometers. Even though microcalorimeters are of small area, they have absorber sizes. greater than 100 micrometers, and therefore the system has a very high collection efficiency. Polycapillary optics are now available with the proper focusing capabilities and can readily be mounted on existing microcalorimeter x-ray detector systems. Because the lens focuses x-rays over a broad energy range, from 200 eV to over 10 keV, the lens is compatible with spectroscopic applications for materials analysis and the collection angle is large enough for practical measurements in materials analysis. An advantage of the invention is that the increase in effective collection area of the microcalorimeter corresponds to a reduction in the time period needed for x-ray collection. The invention also allows placement of the microcalorimeter detector farther from the x-ray source than current designs, which is advantageous for interfacing the detector to a scanning electron microscope or a transmission electron microscope. Another advantage of the present invention is that the effective collection area is improved for a broad energy range of x-rays, thus providing compatibility with spectroscopic applications for material analysis.

DETAILED DESCRIPTION OF THE INVENTION

Figure 1:
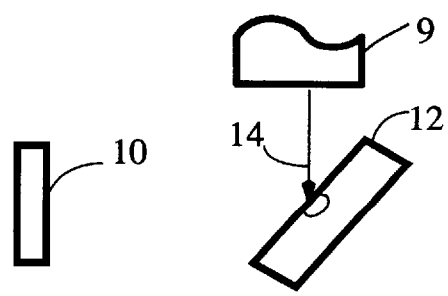
FIG. 1 shows a prior-art EDS detector used in an electron microscope that is positioned relative to an electron beam and a sample.

A geometric orientation of a prior-art EDS detection system used in an electron microscope is shown in FIG. 1 comprising an EDS detector 10 that receives x-ray radiation emitted by a sample 12 that is bombarded by electrons from an electron beam 14 produced by a scanning electron microscope 9. The relative size and placement of the EDS detector 10 relative to typical microcalorimeter detectors (not shown) corresponds to a relatively greater collection angle for the EDS detector 10.

Figure 2:
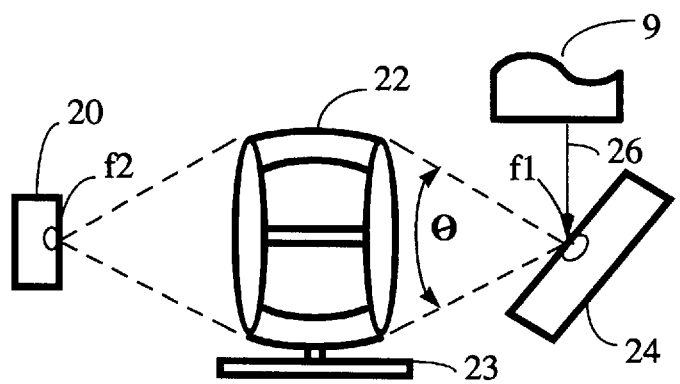
FIG. 2 shows a view of an embodiment of the present invention with a polycapillary x-ray lens positioned between a microcalorimeter detector and a sample in an electron microscope.

A geometric orientation of an embodiment of the present invention is shown in FIG. 2 comprising a microcalorimeter detector 20 that receives x-rays from an x-ray lens 22 which collects x-rays emitted from a sample 24 that is bombarded by electrons in an electron beam 26 produced by a scanning electron microscope 9. The x-ray lens 22 has a first focal point f1 positioned on the sample 24 defining a large solid angle represented as collection angle $\theta$. The x-ray lens 22 has a second focal point f2 positioned on the microcalorimeter detector 20 for focusing x-rays collected by the lens 22.

The x-ray lens 22 is preferably a polycapillary x-ray lens. U.S. Pat. No. 5,192,869, U.S. Pat. No. 5,497,008 and U.S. Pat. No. 5,570,408, all of which are incorporated by reference herein, describe an x-ray polycapillary lens device suitable for use in the current invention and also describe detecting systems; systems with microcalorimeter detectors such as the current invention are not shown.

Polycapillary optics have been found by the inventors to have a collection angle that is large enough for practical measurements for materials analysis with microcalorimeters. X-ray Optical Systems, Inc., Albany, N.Y., currently makes such a lens with a collection angle $\theta$ of 22 degrees and an overall transmission efficiency of 30%. This collection angle combined with the transmission efficiency yields the equivalent of a large detector that is 2.1 mm in diameter placed 2 cm away from a sample. The polycapillary lens has x-ray transmission capability that is approximately constant over x-ray energies from a few eV to 10 keV. To compensate for any variations in transmission efficiency, the microcalorimeter can be calibrated by measuring the x-ray spectrum for samples of known composition or by using x-rays with a uniform energy spectrum over the energy range of interest. Such a uniform source may be obtained by bombarding a sample with high energy electrons and using the "bremstruhlung" results from slowing the electrons in the sample.

The energy transmission efficiency of the capillary optic can also be measured by mounting the optic on a translational stage 23 which can move the optic into and out of the line of sight of the detector. By mathematically dividing the spectra obtained by the detector with and without the optic, the transmission efficiency of the optic is obtained as a function of energy.

The microcalorimeter detector 20 is preferably a particle calorimeter with a normal metal base layer as described in U.S. Pat. No. 5,634,718, which is incorporated herein by reference. This particle calorimeter is preferred because it provides more accurate energy resolution and higher operating speed than competing technologies, but has a small collection area.

The preferred embodiment includes the use of a superconducting transition edge thermometer to measure the temperature rise in the absorber. Operation of a transition edge thermometer is described in U.S. Pat. No. 5,641,961 and in Nuclear Instruments & Methods in Physics Research, section A, volume 370, page 177, (1996). Such a microcalorimeter is described for x-ray detection in Applied Physics Letters, page 1945, published Sep. 23, 1996, which article is incorporated herein by reference.

Figure 3:
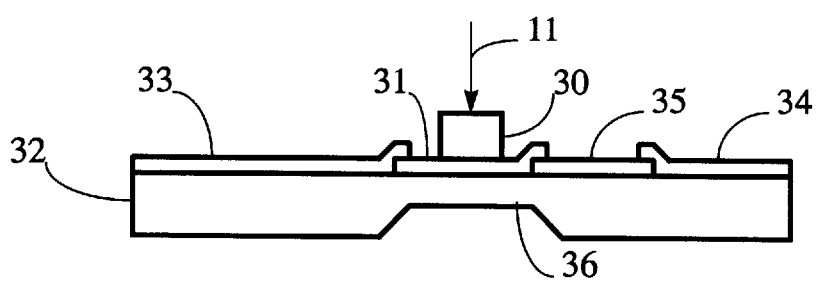
FIG. 3 shows a microcalorimeter detector used in the preferred embodiment of the present invention.

The preferred microcalorimeter to be included in the present invention is shown in FIG. 3. An absorber 30 consists of a dense material operated at cryogenic temperatures of 0.01 to 1 degree Kelvin. An x-ray 11 interacts with the absorber 30 to create heat in the form of electron heat which is distributed into a normal metal base layer 31 and to substrate 32. The substrate 32 is not electrically conducting and has a much lower heat capacity than the absorber 30 and the base layer 31, thus most of the thermal energy is retained in the absorber 30 and the base layer 31. A superconducting lead 33 which has small thermal conductivity is connected to the base layer 31, thus providing an electrical connection, but no thermal conductance. A transition edge thermometer, 35, is connected to base layer 31, providing thermal and electrical contact, and to superconducting lead 34, providing only electrical contact. A thinned substrate 36 is used to reduce the heat capacity of the substrate 32 and reflect back thermal energy phonons so that they are reabsorbed in absorber A and base layer 31. The electrical connection to the device is made to the superconducting leads 33 and 34, respectively, and an amplifier (not shown) is used to measure the current flow. The current measured is that flowing through the transition edge thermometer 35.

The ability to use microcalorimeters with a small detector size also provides another significant advantage. The shape of the detector signal can depend on the strike position of the x-ray on the detector. This effect arises because heat from the x-ray does not diffuse throughout the microcalorimeter instantaneously. It is advantageous to use a small detector because the heat then equilibrates more quickly and thus the detector response is more uniform. Likewise, a smaller detector provides faster sample-collection rates, thus allowing spectra to be collected more quickly.

The large size of the EDS detector 10 in FIG. 1 allows the sample 12 to be moved or the electron beam a 14 to be scanned without requiring realignment of the sample 12 and the detector 10. However, realignment of the x-ray lens 22 and the sample 24 shown in FIG. 2 would be necessary in order to keep the focal point f1 positioned on the part of the sample 24 that is bombarded by the electron beam 26 as the sample 24 is moved or the electron beam 26 is scanned. In this invention, precise alignment of the focal point f1 on the sample 24 may be obtained by maximizing the count rate of the microcalorimeter detector 20 with respect to the position of the sample 24.

Similarly, the microcalorimeter detector 20 may be aligned relative to the x-ray lens 22 by maximizing the x-ray count rate observed by the detector. Movement of the x-ray lens 22 relative to microcalorimeter detector 20 may be performed by a three axis translation stage 23. Motorized and nonmotorized multi-axis positioners are commercially available, such as those from NEW FOCUS, Inc. 2630 Walsh Avenue, Santa Clara, Calif. 95051. Such a translation stage may adjust position inside the electron microscope vacuum chamber.

The position of the focal point f1 on the sample must coincide with that portion of the sample excited by the scanning electron beam. That adjustment is made by adjusting the scanning position of the electron beam 26 or by moving the sample 24 under test in the electron microscope. Proper orientation of the sample and beam is obtained by observing the maximum x-ray count rate at the detector. We have found experimentally that the x-ray transmission through the optic does not change greatly as the electron beam position is changed 10 to 20 micrometers. This implies that x-ray transmission in the optic is acceptable for typical electron scanning ranges utilized in most microanalysis applications.

The present invention is mainly an illustration of the principle of focusing x-ray radiation on a microcalorimeter detector in an x-ray spectrometer and, therefore, is accompanied by a description of specific embodiments. It will be apparent to those skilled in the art that various modifications, substitutions, additions and the like can be made without departing from the spirit of the invention, the scope of which is defined by the claims which follow and their equivalents.

What is claimed is:

1. An x-ray spectrometer for determining the set of characteristic energies produced by a sample under test, said spectrometer having improved collection efficiency comprising:
    an excitation source to excite the emission of x-ray radiation from said sample;
    a microcalorimeter x-ray detector responsive to incident x-ray radiation for producing an output signal representing the energy of the x-ray events incident at said detector; and
    an x-ray lens placed between said sample and said detector, said lens having a first focal point positioned on said sample for collecting a large solid angle of said x-ray radiation and a second focal point positioned on said detector for focusing said x-ray radiation on said detector.

2. The x-ray spectrometer of claim 1 wherein said x-ray lens is a polycapillary lens.

3. The x-ray spectrometer of claim 2 wherein said x-ray lens has a transmission efficiency that varies with respect to x-ray energy, and said spectrometer includes calibrating means to compensate for variations in the transmission efficiency of said x-ray lens.

4. The x-ray spectrometer of claim 3 further comprising an alignment means coupled between said sample and said x-ray lens for aligning said second focal point of said x-ray lens on said detector in accordance with the maximum count of said x-ray events with respect to a fixed time interval.

5. The x-ray spectrometer of claim 4 wherein said excitation source is an electron microscope which bombards said sample with electrons causing said sample to emit x-ray radiation.

6. The x-ray spectrometer of claim 1 wherein said excitation source is an electron microscope which bombards said sample with electrons causing said sample to emit x-ray radiation.

7. The x-ray spectrometer of claim 6 wherein said x-ray lens is a polycapillary lens.

8. The x-ray spectrometer of claim 7 wherein said x-ray lens has a transmission efficiency that varies with respect to x-ray energy, and said spectrometer includes calibrating means to compensate for variations in the transmission efficiency of said x-ray lens.

9. The x-ray spectrometer of claim 1 further comprising an alignment means coupled between said sample and said x-ray lens for aligning said second focal point of said x-ray lens on said detector in accordance with the maximum count of said x-ray events with respect to a fixed time interval.

10. The x-ray spectrometer of claim 9 wherein said x-ray lens is a polycapillary lens.

11. The x-ray spectrometer of claim 10 wherein said excitation source is an electron microscope which bombards said sample with electrons causing said sample to emit x-ray radiation.

12. A method of spectroscopic materials analysis comprising the steps of:
    providing for the excitation of a sample under test to excite the emission of x-ray radiation;
    providing for the collection of said x-ray radiation from a sample under test by an x-ray lens wherein a first focal point of said lens is positioned on the surface of said sample under test; and
    providing for the detection of said x-ray radiation in a microcalorimeter wherein a second focal point of said lens is positioned on said microcalorimeter.

13. The method of claim 12 wherein the transmission efficiency of said x-ray lens varies with respect to x-ray energy, said method further including the steps of:
    providing a translating stage for moving said x-ray lens out of the line of sight of said detector and measuring the x-ray spectra obtained at said detector;
    providing said translating stage for moving said lens into the line of sight of said detector and measuring the x-ray spectra obtained at said detector; and
    mathematically operating on the spectra obtained without said lens and the spectra obtained with said lens to determine calibration factors to compensate for the transmission efficiency of said lens.

14. The method of claim 12 further including the steps of:
    providing a translational stage to align said detector with said x-ray lens to establish the position of said detector at said second focal point by observing the position at which the maximum x-ray count rate is achieved at said detector; and
    providing for the adjustment of said first focal point at said sample by observing the position of said sample at which the maximum x-ray count is achieved at said detector.

15. The method of claim 12 wherein the step of providing for the excitation of said sample is accomplished by the bombardment of said sample in an electron microscope and further including the step of:
    adjusting the location at which said bombardment of said sample occurs to coincide with the location of said first focal point by observing the position at which the maximum x-ray count is achieved at said deteccor.

16. The method of claim 12 further including the steps of:
    providing a translational stage to align said detector with said x-ray lens to establish the position of said detector at said second focal point by observing the position at which the maximum x-ray count rate is achieved at said detector;
    providing for the adjustment of said first focal point at said sample by observing the position of said sample at which the maximum x-ray count is achieved at said detector; and
    wherein the step of providing for the excitation of said sample is accomplished by the bombardment of said sample in an electron microscope and further including the step of:

adjusting the location at which said bombardment of said sample occurs to coincide with the location of said first focal point by observing the position at which the maximum x-ray count is achieved at said detector.

17. The method of claim 16 wherein the transmission efficiency of said x-ray lens varies with respect to x-ray energy, said method further including the steps of:

providing said translational stage for moving said x-ray lens out of the line of sight of said detector and measuring the x-ray spectra obtained at said detector;

providing said translational stage for moving said lens into the line of sight of said detector and measuring the x-ray spectra obtained at said detector; and mathematically operating on the spectra obtained without said lens and the spectra obtained with said lens to determine calibration factors to compensate for the transmission efficiency of said lens.

* * * * *

UNITED STATES PATENT AND TRADEMARK OFFICE
CERTIFICATE OF CORRECTION

PATENT NO. : 5,880,467
DATED : March 9, 1999
INVENTOR(S) : Martinis et al.

It is certified that error appears in the above-identified patent and that said Letters Patent is hereby corrected as shown below:

Title page, item [73] Assignee should read as follows:

The United States of America as represented by the Secretary of Commerce, Washington, D. C.

X-Ray Optical Systems, Inc., Albany, N.Y.

Signed and Sealed this

First Day of August, 2000

*Attest:*

Q. TODD DICKINSON

*Attesting Officer*      *Director of Patents and Trademarks*